(12) United States Patent
Shen et al.

(10) Patent No.: US 9,007,112 B2
(45) Date of Patent: Apr. 14, 2015

(54) LOW POWER SRPG CELL

(71) Applicants: Baiquan Shen, Suzhou (CN); Xiaoxiang Geng, Suzhou (CN); Shayan Zhang, Cedar Park, TX (US)

(72) Inventors: Baiquan Shen, Suzhou (CN); Xiaoxiang Geng, Suzhou (CN); Shayan Zhang, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/191,379

(22) Filed: Feb. 26, 2014

(65) Prior Publication Data

US 2014/0300396 A1 Oct. 9, 2014

(30) Foreign Application Priority Data

Apr. 3, 2013 (CN) .......................... 201310113519.6

(51) Int. Cl.
*H03K 3/289* (2006.01)
*H03K 17/24* (2006.01)
(52) U.S. Cl.
CPC ...................................... *H03K 17/24* (2013.01)
(58) Field of Classification Search
USPC ................................................. 327/143, 202
See application file for complete search history.

(56) References Cited

U.S. PATENT DOCUMENTS

| | | | | |
|---|---|---|---|---|
| 7,123,068 | B1* | 10/2006 | Hoover et al. | 327/202 |
| 7,164,301 | B2* | 1/2007 | Chun | 327/202 |
| 7,683,697 | B2* | 3/2010 | Berzins et al. | 327/534 |
| 7,791,389 | B2* | 9/2010 | Remington | 327/208 |
| 8,076,965 | B2* | 12/2011 | Djaja et al. | 327/202 |
| 8,604,853 | B1* | 12/2013 | Jarrar et al. | 327/202 |
| 2006/0120118 | A1* | 6/2006 | Brosh et al. | 363/25 |
| 2006/0255849 | A1* | 11/2006 | Chun | 327/202 |
| 2008/0315932 | A1* | 12/2008 | Tower et al. | 327/202 |
| 2010/0103005 | A1* | 4/2010 | Nolan et al. | 341/120 |
| 2012/0126781 | A1* | 5/2012 | Narayanan et al. | 324/76.11 |
| 2013/0285460 | A1* | 10/2013 | DeHaven | 307/82 |
| 2013/0314138 | A1* | 11/2013 | Jarrar et al. | 327/202 |
| 2014/0300396 | A1* | 10/2014 | Shen et al. | 327/143 |

* cited by examiner

*Primary Examiner* — Ryan Jager
(74) *Attorney, Agent, or Firm* — Charles Bergere

(57) ABSTRACT

A low power State Retention Power Gating (SRPG) cell has a retention component and a non-retention component, and is operable in a run state, a first retention state, and a second retention state. In the run state, the retention and non-retention components are powered with a supply voltage. In the first retention state, the retention component is powered at the same supply voltage as in the run state, and the non-retention component is powered down. In the second retention state, the retention component is powered at a lower supply voltage than in the run state, and the non-retention component is powered down.

15 Claims, 3 Drawing Sheets

LOW POWER SRPG CELL

BACKGROUND OF THE INVENTION

The present invention relates to integrated circuits and, more particularly, to a low power State Retention Power Gating (SRPG) cell for an integrated circuit.

In order to reduce power consumption, certain devices may be placed in a low-power mode when not active. Some circuits may be deactivated when not in use by shutting down the power supply to the circuit and placing the circuit in a power-saving mode. Shutting down the power supply can reduce leakage currents, leading to an overall reduction in power consumption by the device.

For some circuits, it may be necessary to preserve logic values while the component is deactivated. State Retention Power Gating (SRPG) describes an arrangement in which a subset of the components of the circuit remain powered during a deactivation period in order to retain or preserve the logic state of the circuit, while the remaining components are powered-down.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

The illustrated embodiments of the present invention may for the most part, be implemented using electronic components and circuits known to those skilled in the art, therefore, details will not be explained in any greater extent than that considered necessary as illustrated above, for the understanding and appreciation of the underlying concepts of the present invention and in order not to obfuscate or distract from the teachings of the present invention.

In one embodiment, the present invention is a device including a State Retention Power Gating (SRPG) cell, where the SRPG cell includes a retention component and a non-retention component. The SRPG cell is operable in at least a run state, a first retention state and a second retention state. In the run state, the retention component and the non-retention component are powered; in the first retention state, the retention component is powered at essentially the same supply voltage as in the run state, and the non-retention component is powered down, and in the second retention state, the retention component is powered at a lower supply voltage than in the run state, and the non-retention component is to be powered down.

In another embodiment, the present invention comprises a device having a power management module, where the power management module comprises: a state control register, and a counter, and the device is arranged to receive a retention instruction to enter a retention state, send, in response to the retention instruction, a power gate signal to cause a gated supply voltage to be turned off, send a Down Trigger to cause a non-gated supply voltage to fall from a first value to a second value, the second value being less than the first value, the Down Trigger being sent after the power gate signal, a delay between sending the power gate signal and sending the Down Trigger controlled by the counter.

In yet another embodiment, the present invention provides in one embodiment, the present invention provides a method of controlling a SRPG cell including, supplying, in a run state, a supply voltage at a first level to a first set of components of the SRPG cell and a set of second components in a first mode; transitioning from the run state to a first retention state; supplying, in the first retention state, the supply voltage at the first level to the second set of components, and supplying no supply voltage to the first set of components; transitioning from the first retention state to a second retention state; and supplying, in the second retention state, the supply voltage at a second level to the second set of components, and supplying no supply voltage to the first set of components, where the second level is lower than the first level.

Figure 1:
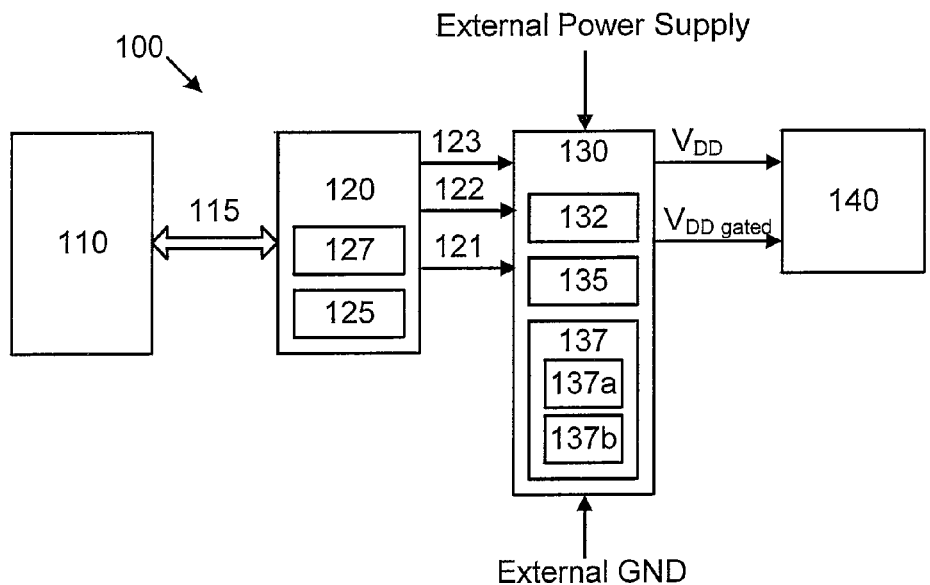
FIG. 1 is a schematic block diagram of an integrated circuit in accordance with an embodiment of the present invention.

Referring now to FIG. 1, a schematic block diagram of an integrated circuit or a device 100 in accordance with an embodiment of the present invention is shown. In this example a CPU 110 is in communication with a power management module 120 by way of an internal bus 115. The power management module 120 may include a counter or delay unit 125 and a register 127. The power management module 120 is arranged to provide control signals to a power supply module 130. The control signals may include power gate signal (pgb) 121, a Down Trigger 122 and a Rise Trigger 123.

The power supply module 130 is arranged to receive power from a power source, and may include one or more of a voltage detector 132, a temperature sensor 135 or a trim register 137. The trim register 137 may include a static trim register 137a and a dynamic trim register 137b. The power supply module 130 may be arranged to provide supply voltages $V_{DD}$ and $V_{DD\_gated}$ to an SRPG cell 140. The SRPG cell 140 may be a flip-flop, for example.

Figure 2:
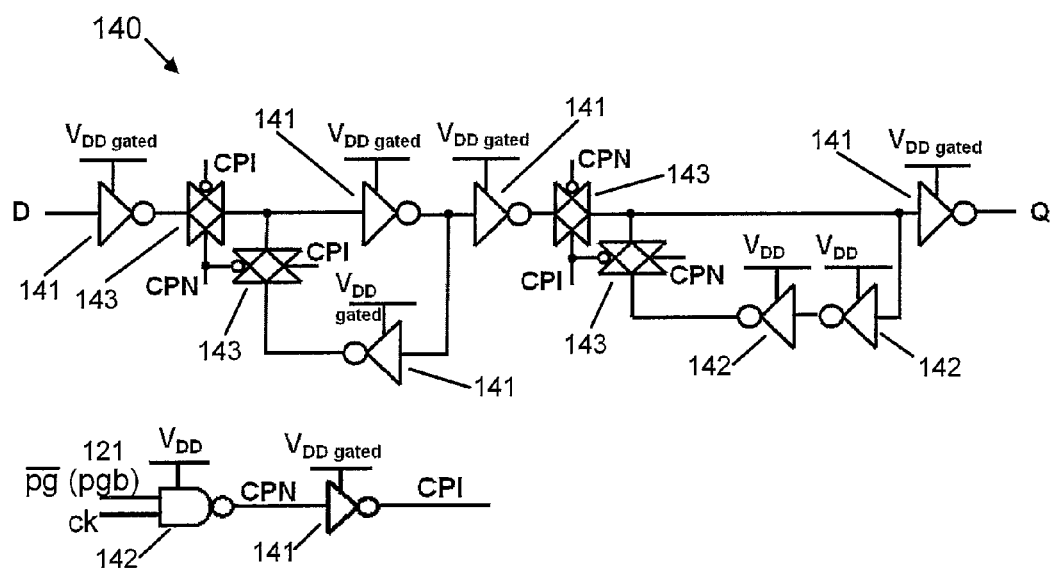
FIG. 2 is a schematic circuit diagram of an SRPG cell in accordance with an embodiment of the present invention.

FIG. 2 shows an example of the SRPG cell 140. The SRPG cell includes a plurality of inverters and clocked transfer gates 143. However, other SRPG cells, e.g. making use of other components, could also be used.

The SRPG cell 140 in this embodiment is a SRPG flip-flop, including two latches. The SRPG cell 140 also includes a circuit for producing a power gated clock signal CPN and its inverse CPI based on a clock signal ck and the power gate signal 121.

The SRPG cell 140 includes two sets of components 141 and 142; each component of the first set of components 141 receives $V_{DD}$ gated from the power supply module 130, and each component of the second set of components 142 receives $V_{DD}$ from the power supply module 130. In some examples the second set of components 142 are a set of components that are necessary and sufficient to preserve a logic value of the SRPG cell in a retention state.

Figure 3:
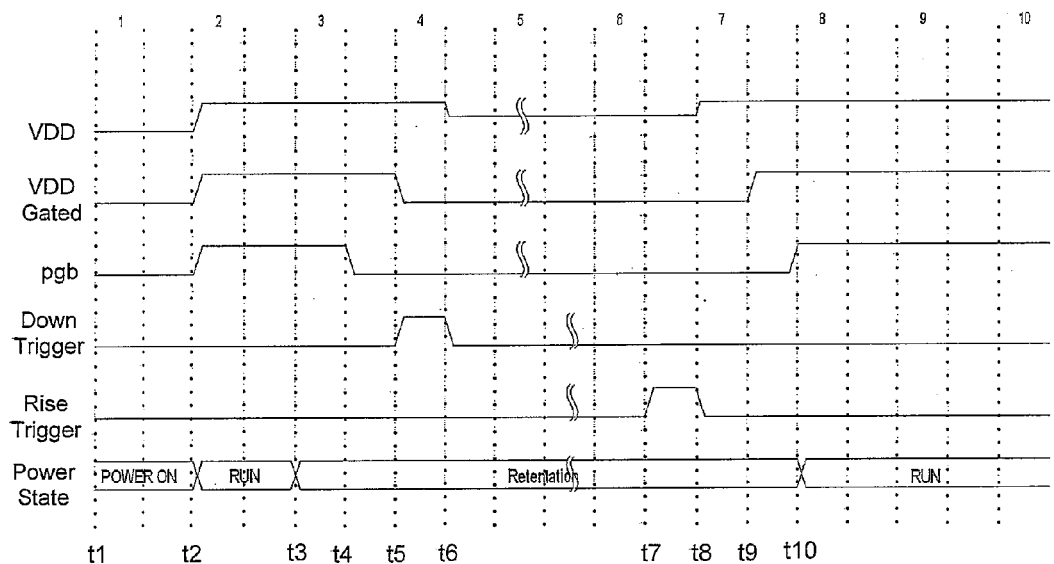
FIG. 3 is a timing diagram showing signals of the circuit of FIG. 2.

FIG. 3 shows a timing diagram of the signals according to an example. At t1 the system is in a Power On mode, and all signals are low. At t2 the system is moved into a RUN state, and $V_{DD}$ and $V_{DD}$ Gated rise to a first voltage level, and the power gate signal (pgb) 121 changes to a high level. The value of the first voltage level may be 1.2V for 90 nm process, for example.

At t3 the system is placed into a Retention state by a retention command from the CPU to the power management module 120. The power management module changes the power gate signal 121 to a low level at t4. At t5, in response to the power gate signal 121, the power supply module 130 turns off $V_{DD}$ Gated, such that the first set of components 141 is powered down. The logic state of the SRPG cell 140 is preserved by the components in the second set of components 142, which continue to receive power at t5. The second set of components 142 may be referred to as retention components, and the first set of components 141 may be referred to as non-retention components.

At time t5 the power management module 120 sends a Down Trigger 122 to the power supply module 130. The counter or delay unit 125 may determine the timing for generation of the Down Trigger. In some examples the counter or delay unit 125 may determine whether a predetermined period of time has elapsed since the entry into the retention state, and the Down Trigger 122 may be sent when it is determined that the predetermined period of time has elapsed. This allows a delay to be provided between the start of the retention period and the sending of the Down Trigger, and may improve reliability of preserving the logic state of the SRPG cell 140. This delay may be of the order of several microseconds, for example. In some examples, the delay may be preset. In some examples, the delay may be programmed (e.g. by a user).

At t6, in response to receiving the Down Trigger 122, the power supply module 130 reduces the value of $V_{DD}$ that is supplied to the second set of components from the first voltage level to a second voltage. The second voltage level is less than the first voltage level, but is sufficient to preserve the logic state of the SRPG cell in the retention state. In the retention (inactive) state, the SRPG cell 140 is static in the retention state, and so there is headroom to reduce the $V_{DD}$ (the non-gated voltage) without loss of the logic state stored by the SRPG cell.

At time t7, in response to a receiving a wake up command, the power management module 120 sends a Rise Trigger 123 to the power supply module 130. At time t8, in response to the Rise Trigger 123, power supply module raises $V_{DD}$ from the second voltage level to the first level. Thus, the second set of components may receive the same supply voltage as they would in a normal Run state.

When, at time t9, the power supply module 130 determines that $V_{DD}$ has reached the first level (e.g. based on a determination by voltage detector 132) the power supply module 130 turns on $V_{DD}$ gated at the first voltage level, thus supplying the first set of components with a voltage at the same level as they would receive in a normal Run state.

At t10, when both $V_{DD}$ and $V_{DD\,gated}$ are at the first voltage level, the power gate signal 121 is set to a high value, and the system returns to a Run state from the Retention state.

During the Retention state the second components (which may correspond to components of a slave latch, for example) preserve the logic value that the SRPG cell had in the Run state, immediately prior to entering the Retention state. When the Retention state has been exited, and the Run state entered, the logic value preserved by the second components may be restored to the SRPG cell as a whole.

In relation to the above description of the timings, it is noted that voltage and logic signal transitions will not be instantaneous, and so some references to the timings may be approximate with respect to the time taken for transitions to occur.

Table 1 shows the state of the system and the values of $V_{DD}$ and $V_{DD}$ Gated as illustrated in FIG. 3. The table includes a first retention state, in which $V_{DD}$ Gated is turned off, and $V_{DD}$ is at the first level. A second retention state is also included, to describe the state when $V_{DD}$ is at the second level and $V_{DD}$ Gated is turned off. Note that between times t3 and t5 and between times t9 and t10, the system is in a Retention state, but is not in either of the first or second retention states. Thus, the first and second retention states do not necessarily occupy the whole of the period (retention period) that the system is in the Retention sate.

TABLE 1

| State | Time | $V_{DD}$ | $V_{DD}$ gated |
|---|---|---|---|
| Run | t2-t3 | $1^{st}$ level | $1^{st}$ level |
| $1^{st}$ retention | t5-t6 | $1^{st}$ level | Off |
| $2^{nd}$ retention | t6-t8 | $2^{nd}$ level | Off |
| $1^{st}$ retention | t8-t9 | $1^{st}$ level | Off |
| Run | t10- | $1^{st}$ level | $1^{st}$ level |

By reducing $V_{DD}$ in the second retention state, leakage currents in the second set of components 142 are reduced relative to the $1^{st}$ retention state, and power-saving can be achieved.

Figure 4:
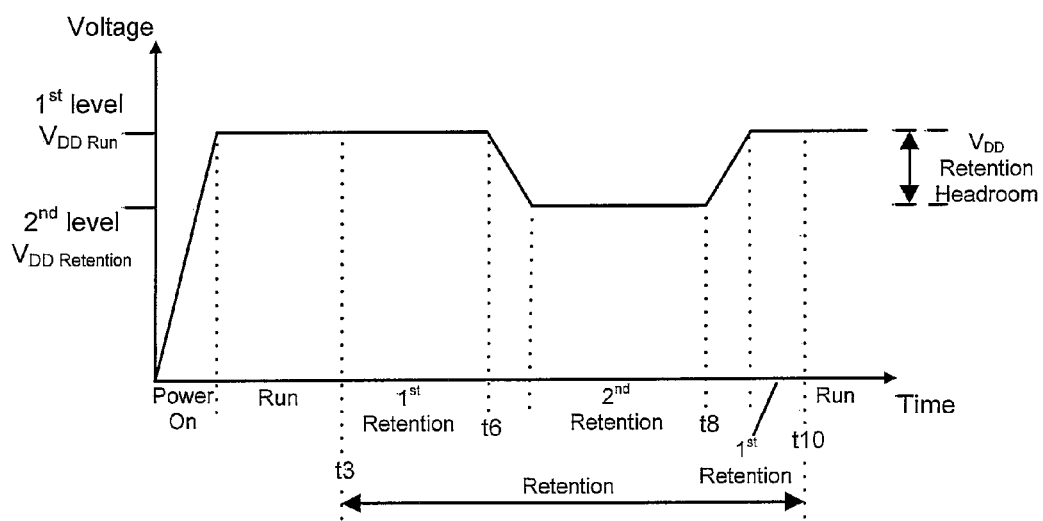
FIG. 4 is a graph showing values of voltage ($V_{DD}$) over time for different states of a circuit in accordance with an embodiment of the present invention.

FIG. 4 shows an example of a value of $V_{DD}$ in different states. In Run and first retention states, $V_{DD}$ is at the first level. The first level may be referred to as $V_{DD}$ Run. In the second retention state, $V_{DD}$ is at the second level, which may be referred to as $V_{DD}$ Retention. The difference between the first and second voltage levels is referred to as the voltage headroom, or $V_{DD}$ retention headroom. The headroom may be process, voltage and/or temperature dependent. In some examples the headroom may be approximately 300 mV. That is, the second level is 300 mV less than the first level.

The $V_{DD}$ retention headroom may be controlled by trim register 137 of the power supply module 130. In examples having a static trim register 137a, a static headroom may be used, e.g. for process adjust. In some examples the static trim register may store a factory-set trim value indicating the static headroom. The factory-set trim value may be based on a wafer test of the same fabrication lot. A static headroom trim or control can be performed during a factory testing phase of the devices, e.g. before shipping them to end users or customers.

The acceptable headroom may be voltage and/or temperature dependent. Here "acceptable" may correspond with a largest headroom (or a minimum second voltage level) that does not risk the logic value of the SRPG cell being lost. The acceptable headroom may take into account, for example, design margin variations caused by production processes and uncertainties in voltage and/or temperature. The headroom voltage may depend on a total number of SRPG cells embedded in the device. In some examples the number of SRPG cells may statistically influence the mean and standard deviation of the headroom voltage.

The headroom may be controlled dynamically (e.g. during functional operation mode of the device in an application specific customer environment), for example to adjust the static preset headroom voltage in responding to changes in device operating temperature. The static headroom voltage may be reduced in responding to an increase in device operating temperature, for example. In some examples the device operating temperature may be determined using an on-chip temperature sensor 135. Dynamic control (e.g. to adjust for temperature variation) may be achieved using a dynamic trim register 137b that is coupled to temperature sensor 135, for example.

An algorithm or look-up table may be used to determine the value of the dynamic trim register and/or its effect on the headroom voltage. When an algorithm is used, it may be provided in hardware logic or firmware, for example. An algorithm may include a programmable hysteresis control for the dynamic trim to avoid unnecessarily frequently changes in the headroom voltage caused by intermittent random events, for example voltage noise or glitches. A look-up table may contain a set of temperature and headroom voltage pair values stored in the dynamic trim register 137b, for example.

In some examples the static trim register controls the headroom to be 300 mV. In some examples the static trim register controls the headroom to a value between 300 mV and 400 mV, inclusive. The dynamic trim register may increase or decrease the headroom voltage by a smaller value, for example by a 50 mV. In one embodiment, a range of 300 mV-400 mV of headroom can be generated by inserting a voltage clamping device with a MOSFET threshold voltage drop from a normal full VDD level.

More generally, the trim register 137 is an example of a headroom voltage controller. The headroom voltage controller may include a static controller (e.g. static trim register 137a) and/or the headroom controller may include a dynamic controller (e.g. dynamic trim register 137b). The headroom voltage controller may include non-volatile memory, such as flash memory or ROM. A static headroom voltage controller or a dynamic headroom voltage controller may include non-volatile memory, such as flash memory or ROM. A fuse may be used as a static headroom controller.

In some examples the power management module 120 is controlled by CPU 110. The power management module may be controlled by register based and/or instruction based methods.

According to a register based control method, the CPU 110 may set a retention bit in a register of the power management module 120. This corresponds with the CPU 110 sending a command to the power management module 120 to place the system in a retention state. When a predetermined interrupt occurs, the CPU 110 sets a wake up bit in the power management module 120, corresponding to the wake up command. The system then re-enters the run state when $V_{DD}$ has returned to the first level. In some examples the predetermined interrupt may be an external wakeup source, such as a reset, a non-maskable interrupt, etc.

In some examples of register based control, the CPU may set bit fields of a low power operation register in the power management module 120. The low power operation register determines when and how the system will go into a retention state. For example, in a cellular base station, a plurality of networking communication chips may be put into low-power mode (retention state) during off-peak periods (e.g. late at night and early morning in the region covered by the base station).

According to an instruction based control method, the CPU 110 executes a retention instruction that causes the chip to directly enter the retention state. When a predetermined interrupt occurs, the CPU 110 executes a wake up instruction, and the system re-enters the run state when $V_{DD}$ has returned to the first level. This may allow control of entry to and exit from the retention mode by user application-mode instructions, which may be software dependent. For example, a system may directly enter a retention state when an "energy conservation" instruction is executed.

Figure 5:
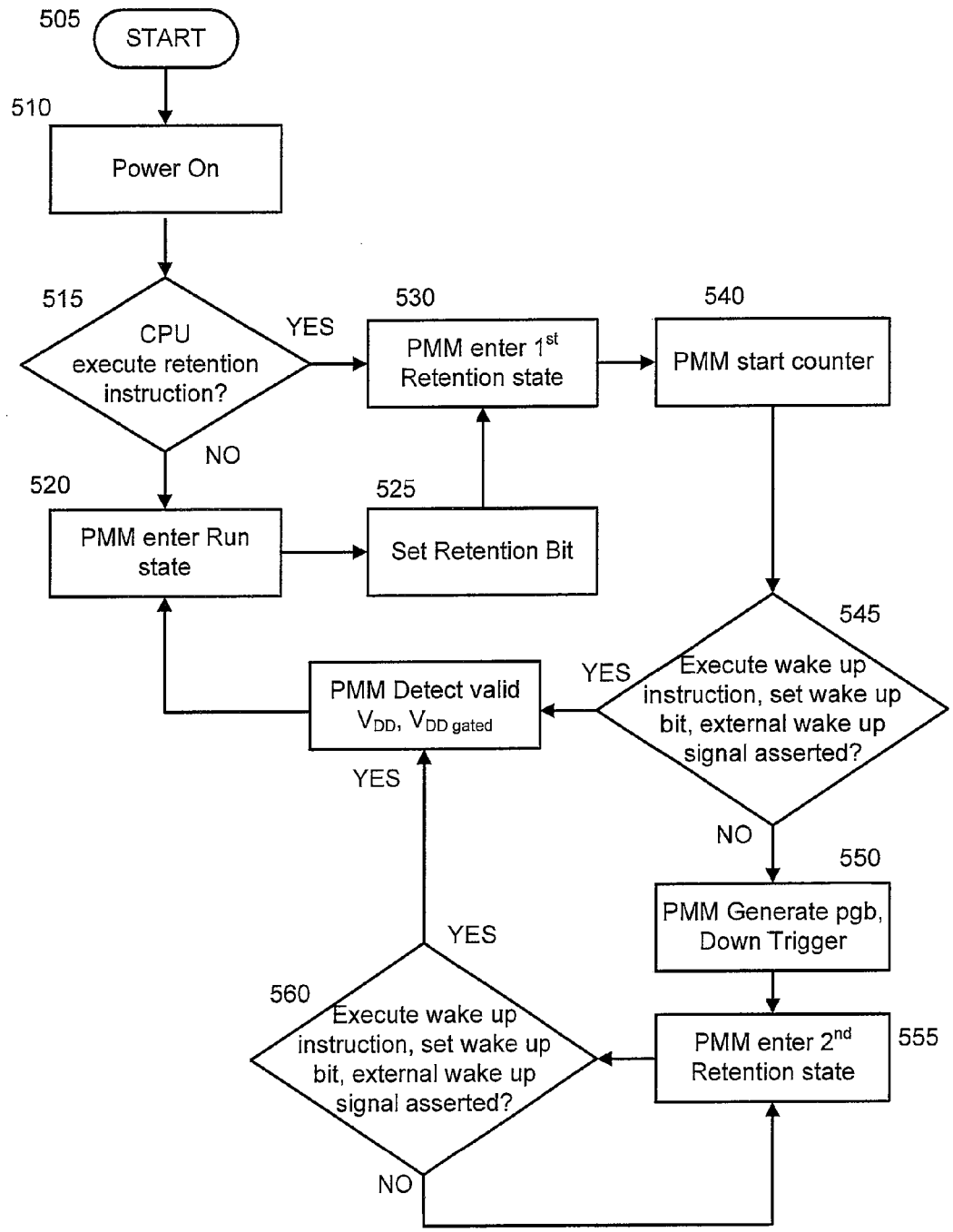
FIG. 5 is a flow chart of a method of reducing power in a circuit having SRPG cells in accordance with an embodiment of the present invention.

FIG. 5 illustrates a method 500 according to an example. The method 500 begins at 505 and at 510 the system is powered on. At 515 it is determined whether the CPU 110 has executed a retention instruction. If a retention instruction has been executed, the method proceeds to 530. Otherwise, the method proceeds to 520 and the power management module 120 enters the Run state. At 525 the retention bit is set, and the method proceeds to 530.

At 530 the power management module 120 enters Retention state. At 540 the power management module 120 starts the counter 125. At 545 it is determined if a wake-up interrupt has occurred (e.g. a wake up instruction has been executed, a wake up bit has been set, or an external wakeup source has been asserted). If the result of the determination is yes, the method moves to 570. If the determination is no at step 545, the method moves to step 550.

At 550 the power gate signal 121 is generated and sent, and after a delay determined by the counter, the Down Trigger 122 is also generated and sent. At 555 the power management module enters a $V_{DD}$ Down state, with the system in the second retention state.

At 560 it is determined if a wake-up interrupt has occurred (e.g. a wake up instruction has been executed, a wake up bit has been set, or an external wakeup source has been asserted). If the determination is negative, the method returns to 555 and the system remains in the second retention state. If the determination is positive, the method moves to 565.

At 565 the power management module 120 generates and sends a Rise Trigger and the power management module 120 enters a $V_{DD}$ Rise state. $V_{DD}$ is increased to the first level, and when $V_{DD}$ is determined to be at the first level, $V_{DD}$ Gated is turned on.

At 570 it is determined that $V_{DD}$ and $V_{DD}$ Gated have reached the first level, and then the method moves to 520 and the power management module 120 enters the Run state.

The SRPG cell may be a flip-flop. The SRPG cell may have a slave latch or retention stage that includes the second set of components.

In the foregoing specification, references to a "system" may refer to a single chip, a SoC (System on Chip) or some other collection of components including the SRPG cell. The functions herein associated with CPU 110 could be performed by one or more alternative processing devices. For example, CPU 110 may be replaced with a microcontroller. In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A device including an State Retention Power Gating (SRPG) cell, the SRPG cell comprising:
   at least one retention component; and
   at least one non-retention component, wherein
   the SRPG cell is operable in at least a run state, a first retention state and a second retention state,
   in the run state, the at least one retention component and the at least one non-retention component receive a supply voltage,
   in the first retention state, the at least one retention component receives essentially a same supply voltage as in the run state, and the at least one non-retention component is powered down, and
   in the second retention state, the at least one retention component receives a lower supply voltage than in the run state, and the at least one non-retention component is powered down,
   wherein a transition between the run state and the first retention state, or between the first retention state and the second retention state is based on a power management policy, the power management policy comprising:
   an instruction based policy that includes transitioning state directly in response to an instruction from a Central Processing Unit (CPU); and
   a register based policy that includes transitioning state based on a value stored in a register.

2. The device of claim 1, wherein the device is arranged to:
   transition from the run state to the first retention state and subsequently from the first retention state to the second retention state; and
   transition from the second retention state to the first retention state and subsequently from the first retention state to the run state.

3. The device of claim 1, wherein the device includes a controller to set a headroom voltage and to control the lower supply voltage such that a difference between the lower supply voltage and the supply voltage in the run state is equal to or less than the headroom voltage.

4. The device of claim 3, wherein the controller is arranged such that the headroom voltage is based on at least one of:
   variation, between the device and other devices, in device properties caused by variation in production of the devices,
   inaccuracy and variation of the supply voltage in the first retention state and the second retention state,
   information from a temperature sensor, and
   a total number of the SRPG cells embedded in the device.

5. The device of claim 3, wherein the controller includes a static controller and a variable controller for controlling the headroom voltage, wherein the static controller sets the headroom voltage at a fixed value, and the variable controller dynamically modifies the value of the headroom voltage set by the static controller.

6. The device of claim 3, wherein the controller includes, for controlling the headroom voltage, at least one of a static trim register, a variable trim register, a non-volatile memory, and a fuse.

7. A method of controlling a State Retention Power Gating (SRPG) cell, the method comprising:
supplying, in a run state, a supply voltage at a first level to a first set of components of the SRPG cell and a second set of components in a first mode;
transitioning from the run state to a first retention state;
supplying, in the first retention state, the supply voltage at the first level to the second set of components, and supplying no supply voltage to the first set of components;
transitioning from the first retention state to a second retention state;
supplying, in the second retention state, the supply voltage at a second level to the second set of components, and supplying no supply voltage to the first set of components, wherein the second level is lower than the first level;
setting a retention bit, wherein the transitioning from the run state to the first retention state is in response to the setting of the retention bit; and
checking the retention bit after transitioning to the first retention state, wherein the transitioning from the first retention state to the second retention state is in response to the checking confirming that the retention bit is still set, and a predetermined timing condition in a counter for generating a Down Trigger is met.

8. The method of claim 7, further comprising:
transitioning from the second retention state to the first retention state; and
transitioning from the first retention state to the run state.

9. The method of claim 8, wherein:
the transitioning from the second retention state to the first retention state is in response to setting the retention bit.

10. The method of claim 8, wherein:
the transitioning from the second retention state to the first retention state is in response to executing a retention wakeup instruction.

11. The method of claim 8, further comprising:
following the transition from the second retention state to the first retention state, determining that the supply voltage to the second set of components has reached the first level.

12. The method of claim 7, further comprising:
executing a retention instruction,
wherein the transitioning from the run state to the first retention state is in response to the executing the retention instruction.

13. The method of claim 12, further comprising:
executing a wake up instruction after transitioning to the first retention state and before transitioning to the second retention state; and
in response to the wake up instruction, transitioning from the first retention state to the run state.

14. The method of claim 7, further comprising providing a delay between transitioning from the run state to the first retention state and transitioning from the first retention state to the second retention state.

15. The method of claim 7, further comprising:
maintaining a headroom voltage, in the second retention state, the second level being based on the headroom voltage, after the transitioning from the first retention state to the second retention state, wherein
the headroom voltage is based on a dynamic trim register accessible when the SRPG cell is operating in the run state.

* * * * *